United States Patent
Lee et al.

(10) Patent No.: US 8,572,444 B2
(45) Date of Patent: Oct. 29, 2013

(54) MEMORY APPARATUS AND TESTING METHOD THEREOF

(75) Inventors: Jih-Nung Lee, Hsinchu (TW); Shuo-Fen Kuo, Tainan (TW); Chi-Feng Wu, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 274 days.

(21) Appl. No.: 12/722,538

(22) Filed: Mar. 12, 2010

(65) Prior Publication Data
US 2010/0235695 A1 Sep. 16, 2010

(30) Foreign Application Priority Data
Mar. 12, 2009 (TW) .............................. 98108009 A

(51) Int. Cl.
*G11C 29/00* (2006.01)
(52) U.S. Cl.
USPC .......................................... 714/719; 714/763
(58) Field of Classification Search
USPC .................. 714/718–723, 710–711, 763
See application file for complete search history.

(56) References Cited

U.S. PATENT DOCUMENTS

| 4,903,268 A * | 2/1990 | Hidaka et al. ................. 714/766 |
| 5,233,614 A * | 8/1993 | Singh ............................. 714/723 |
| 5,737,563 A * | 4/1998 | Shigeeda ........................... 711/5 |
| 6,343,366 B1 * | 1/2002 | Okitaka ......................... 714/733 |
| 6,701,461 B2 * | 3/2004 | Oura ................................. 714/42 |
| 6,829,181 B1 * | 12/2004 | Seitoh ........................... 365/201 |
| 7,308,621 B2 | 12/2007 | Adams |
| 7,373,583 B2 | 5/2008 | Hummler |
| 7,467,337 B2 * | 12/2008 | Nakamura et al. ............. 714/704 |
| 7,840,876 B2 * | 11/2010 | Sturm et al. .................. 714/766 |
| 2008/0072118 A1 * | 3/2008 | Brown et al. ................. 714/763 |
| 2009/0132876 A1 * | 5/2009 | Freking et al. ................ 714/723 |

FOREIGN PATENT DOCUMENTS

TW 396539 7/1998

OTHER PUBLICATIONS

English Abstract of TW396539 (published Jul. 15, 1998).

* cited by examiner

*Primary Examiner* — Steve Nguyen
(74) *Attorney, Agent, or Firm* — McClure, Qualey & Rodack, LLP

(57) ABSTRACT

A memory apparatus and a related testing method are provided in the present invention. The memory apparatus includes a memory and a testing module. The testing module includes an error recording unit for recording corresponding addresses of bit errors occurred in the memory. The testing module determines whether the memory has multi-bit error according to the addresses recorded in the error recording unit. The memory is an ECC memory.

13 Claims, 5 Drawing Sheets

| V1 | Addr1 | EB1 |
|----|-------|-----|
| V2 | Addr2 | EB2 |
| V3 | Addr3 | EB3 |
| ⋮ | ⋮ | ⋮ |
| VN | AddrN | EBN |

FIG. 4

MEMORY APPARATUS AND TESTING METHOD THEREOF

BACKGROUND OF THE INVENTION

1. Field of the Invention

The present invention relates to a memory apparatus and a related testing method, and more particularly, to an error correction code (ECC) memory and a related testing method.

2. Description of the Prior Art

The memory is an essential electronic component in electronic products. However, the data accuracy of the memory may decrease if the manufacturing process of the memory has defects or as its access times increase. In order to solve this problem of causing errors in data, an error correction codes (ECC) logic circuit is usually adopted to repair the erroneous data.

In general, when a test is performed on an ECC memory, the ECC logic circuit is enabled, which is also called as the ECC-on test. When a storage block with an identical address in the memory has multi-bit error, such error cannot be detected if a common testing algorithm is adopted. In addition, current testing methods for the ECC memory are unable to know the error number and the error status of the memory, and therefore an error tolerance is unable to be controlled.

SUMMARY OF THE INVENTION

It is therefore one of the objectives of the claimed invention to provide a memory apparatus having a testing module for testing an ECC memory and a related testing method to solve the abovementioned problems.

According to an exemplary embodiment of the present invention, a memory apparatus is provided. The memory apparatus includes a memory and a testing module. The memory includes a plurality of data storage blocks, wherein each data storage block has a corresponding address and stores a plurality of data bits. The testing module consists of a test pattern generator and at least one testing unit. The test pattern generator generates a test pattern to the memory. The testing unit includes a first judgment circuit, an error recording unit, and a second judgment circuit. The first judgment circuit reads a first data bit and a second data bit of the memory, and determines whether the first data bit and the second data bit have an error according to the test pattern, wherein the first data bit corresponds to a first address in the memory and the second data bit corresponds to a second address in the memory. The error recording unit is coupled to the first judgment circuit for recording the first address when the first data bit has the error. The second judgment circuit is coupled to the error recording unit for comparing the second address in the memory with the first address recorded in the error recording unit so as to determine whether the memory has multi-bit error. The memory is an ECC memory.

According to another exemplary embodiment of the present invention, a testing method for testing a memory is provided. The memory includes a plurality of data storage blocks, wherein each data storage block has a corresponding address and stores a plurality of data bits. The testing method includes the steps of: generating a test pattern to the memory; reading a first data bit and a second data bit of the memory; determining whether the first data bit and the second data bit have an error according to the test pattern, wherein the first data bit is stored in a first address in the memory and the second data bit is stored in a second address in the memory; recording the first address into an error recording unit when the first data bit has the error; and comparing the second address in the memory with the first address recorded in the error recording unit, so as to determine whether the memory has multi-bit error.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram illustrating an exemplary embodiment of the error recording unit shown in FIG. 3.

DETAILED DESCRIPTION

Figure 1:
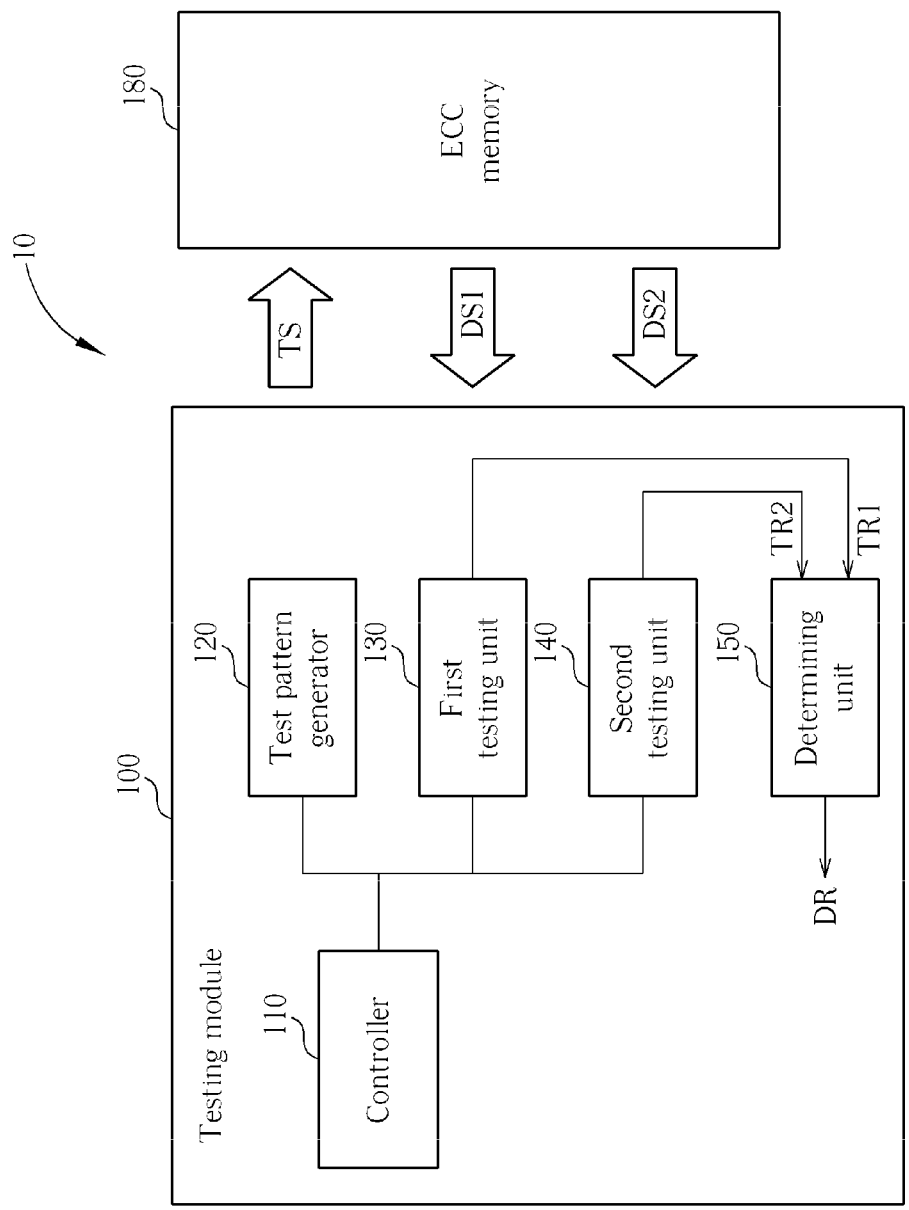
FIG. 1 is a diagram of a memory apparatus according to a first embodiment of the present invention.

Please refer to FIG. 1. FIG. 1 is a diagram of a memory apparatus 10 according to a first embodiment of the present invention. The memory apparatus 10 consists of an error correction code (ECC) memory 180 and a testing module 100. The testing module 100 includes a controller 110, a test pattern generator 120, a first testing unit 130, a second testing unit 140, and a determining unit 150.

The controller 110 controls the operations of the testing module 100. The test pattern generator 120 is coupled to the ECC memory 180 for generating various test patterns TS to the ECC memory 180. The first testing unit 130 is coupled to the ECC memory 180 for testing a data DS1 provided by the ECC memory 180 to generate a first testing result TR1 according to the test patterns TS generated by the test pattern generator 120. The second testing unit 140 is coupled to the ECC memory 180 for testing a data DS2 provided by the ECC memory 180 to generate a second testing result TR2 according to the test patterns TS generated by the test pattern generator 120. The determining unit 150 is coupled to the first testing unit 130 as well as the second testing unit 140 for determining whether the ECC memory 180 passes a test by reference to the first testing result TR1 and the second testing result TR2.

Figure 2:
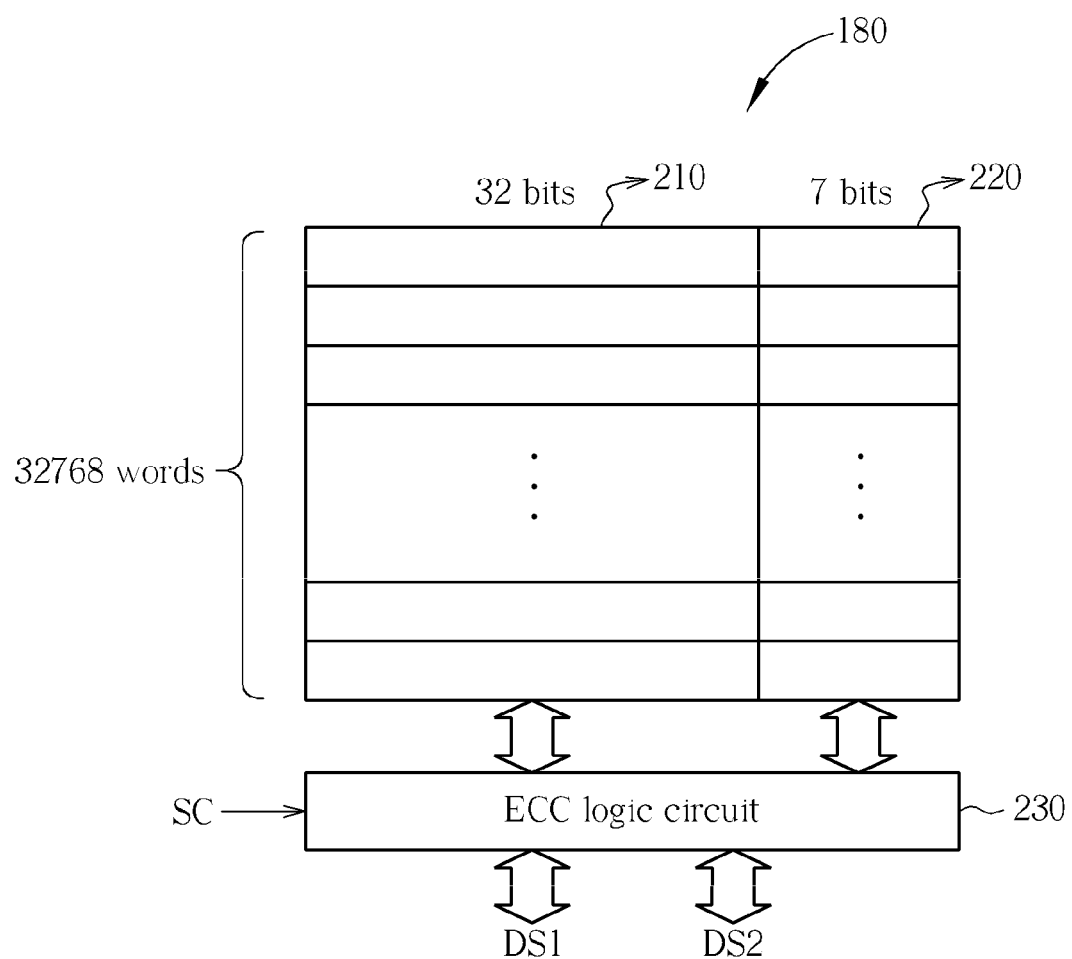
FIG. 2 is a diagram illustrating the ECC memory shown in FIG. 1.

Please refer to FIG. 2. FIG. 2 is a diagram illustrating the ECC memory 180 shown in FIG. 1. As shown in FIG. 2, the ECC memory 180 includes a plurality of data storage blocks 210, a plurality of parity bit storage blocks 220, and an ECC logic circuit 230. Each data storage block 210 can store a plurality of data bits, and each parity bit storage block 220 can store a plurality of parity bits.

Take the ECC memory 180 shown in FIG. 2 as an example, totally 32768 data storage blocks 210 and 32768 parity bit storage blocks 220 are included. In other words, totally 32768 addresses are included, wherein each address is capable of storing thirty-two data bits (i.e. a word) as well as seven parity bits. Please note that the ECC memory 180 shown in FIG. 2 is merely an example for illustrating the present invention, and in no way should be considered to be limitations of the scope of the present invention.

Moreover, the ECC logic circuit 230 is controlled by a selecting signal SC. When the ECC logic circuit 230 is enabled by the selecting signal SC, the ECC memory 180 generates the data DS1 to the first testing unit 130 shown in FIG. 1 according to the plurality of data bits stored in the data storage blocks 210 and the plurality of parity bits stored in the parity bit storage blocks 220. When the ECC logic circuit 230 is disabled by the selecting signal SC, the ECC memory 180 generates the data DS2 to the second testing unit 140 shown in FIG. 1 according to the plurality of data bits stored in the data storage blocks 210 only. In other words, the first testing unit 130 adopts the data DS1 that is provided when the ECC logic circuit 230 is enabled for testing (also called as an ECC-on test), while the second testing unit 140 adopts the data DS2 that is provided when the ECC logic circuit 230 is disabled for testing (also called as an ECC-off test).

According to an embodiment of the present invention, the controller 110 is capable of controlling the first testing unit 130 to perform the test first (i.e., an ECC-on test) and then controlling the second testing unit 140 to perform the test (i.e., an ECC-off test). During the testing procedure, the determining unit 150 can determine whether the ECC memory 180 passes the test or not according to the first testing result TR1 or the second testing result TR2.

Since there are many kinds of testing methods for the first testing unit 130 (i.e., an ECC-on test), further description is thereby omitted herein for brevity. Hence in the following descriptions, operations of the second testing unit 140 when the ECC logic circuit 230 is disabled (i.e. ECC-off test) are detailed.

Figure 3:
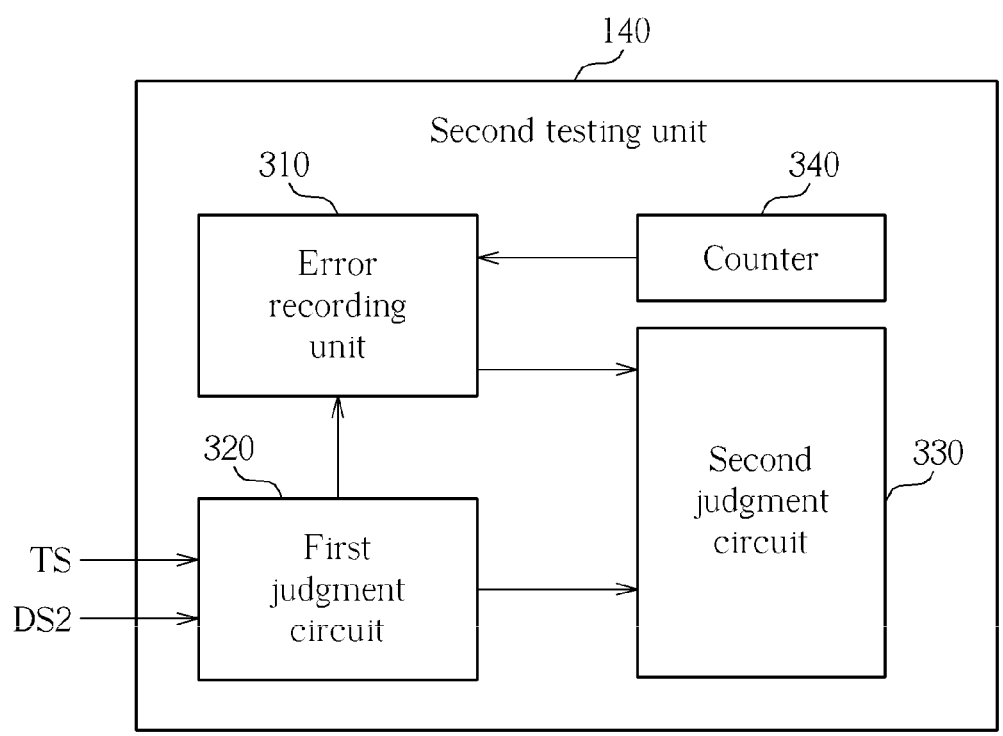
FIG. 3 is a diagram illustrating an exemplary embodiment of the second testing unit shown in FIG. 1.
Figure 4:
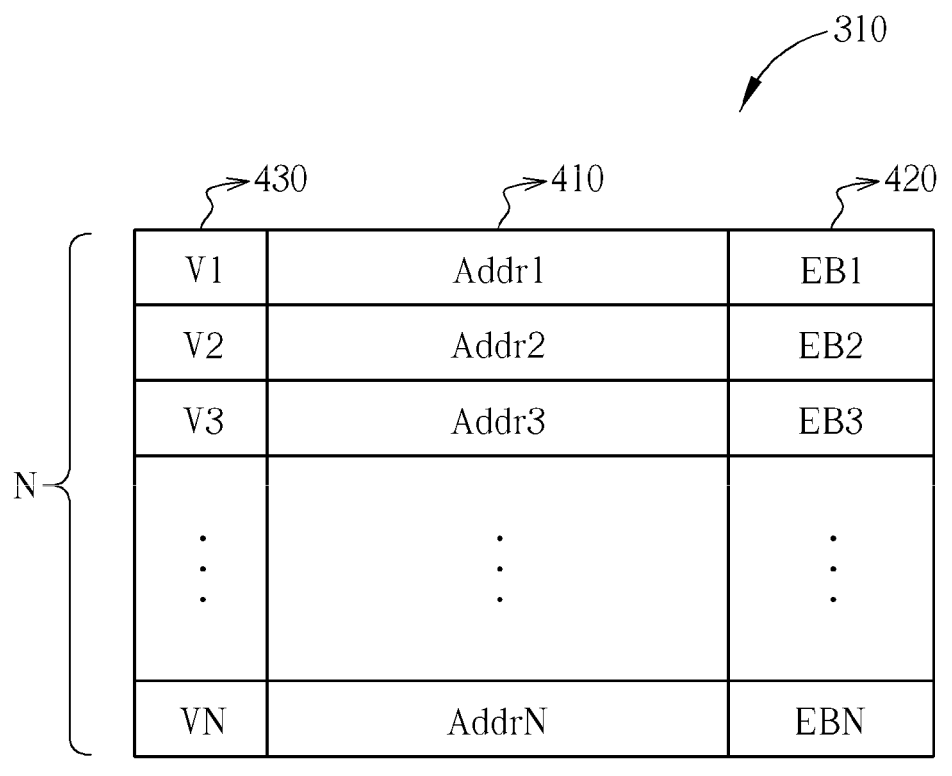

Please refer to FIG. 3 together with FIG. 4. FIG. 3 is a diagram illustrating an exemplary embodiment of the second testing unit 140 shown in FIG. 1, and FIG. 4 is a diagram illustrating an exemplary embodiment of the error recording unit 310 shown in FIG. 3. As shown in FIG. 3, the second testing unit 140 consists of an error recording unit 310, a first judgment circuit 320, and a second judgment circuit 330. As shown in FIG. 4, the error recording unit 310 includes a plurality of address fields 410 and a plurality of bit fields 420. Each address field 410 is used for storing an error address corresponding to the erroneous data in the ECC memory 180, and each bit field 420 is used for storing an error bit occurred in the error address corresponding to the erroneous data in the ECC memory 180. For example, assume that there is an error occurred in the fifth bit in the address 0 of the ECC memory 180. At this time, "0" is written into the address field 410 and "5" is written into the bit field 420, and so on.

Furthermore, the error recording unit 310 further consists of a plurality of valid bit fields 430, which are representative of the validity of the corresponding address fields 410 and the bit fields 420. For example, at the beginning of the test, logic "0" is written into all of the valid bit fields 430, which represents that all the address fields 410 and all the bit fields 420 in the error recording unit 310 currently are invalid. If an error is occurs in the ECC memory 180, its error address and error bit will be stored into the error recording unit 310, such as the address filed Addr1 and the bit field EB1. At this time, the valid bit V1 of the corresponding valid bit field is rewritten as logic "1", which indicates that the values of the address filed Addr1 and the bit field EB1 are valid now. Therefore, invalid address fields 410 and invalid bit fields 420 can be avoided to prevent errors.

In this embodiment, the first judgment circuit 320 reads the data DS2 outputted from the ECC memory 180 and then compares the data DS2 with the test pattern TS generated by the test pattern generator 120, so as to determine whether the ECC memory 180 has data error or not. If the ECC memory 180 has the data error, the second judgment circuit 330 further determines whether the error address of this data error in the ECC memory 180 is the same as the address stored in the error recording unit 310 and whether the error bit of this data error in the ECC memory 180 is the same as the bit stored in the error recording unit 310, so as to determine whether the ECC memory 180 has multi-bit error. In the following descriptions, a detailed example is cited for illustrations.

At the beginning of the test, assume that a test pattern with all logic "0" is generated to the ECC memory 180, and also assume that there are data errors occurred at the $5^{th}$ data bit of the address 0 and the 8.sup.th data bit of the address 6 in the ECC memory 180, that is, these two data bits are written as logic "1". In that case, after the first judgment circuit 320 reads the data DS2 outputted from the ECC memory 180 and compares the data DS2 with the test pattern with all logic "0", it can judge that there are the data errors occurred at the 5.sup.th data bit of the address 0 and the 8.sup.th data bit of the address 6 in the ECC memory 180. Consequently the address 0 is written into the field Addr1 among the address fields 410, and the 5.sup.th data bit is written into the field EB1 among the bit fields 420. In addition, the address 6 is written into the field Addr2 among the address fields 410, and the 8.sup.th data bit is written into the field EB2 among the bit fields 420.

After that, assume that a test pattern with all logic "1" is generated to the ECC memory 180, and also assume that there are data error occurred at the $12^{th}$ data bit of the address 0, that is, this bit is written as logic "0". In that case, after the first judgment circuit 320 reads the data DS2 outputted from the ECC memory 180 and compares the data DS2 with the test pattern with all logic "1", it can judge that there is the data error occurred at the $12^{th}$ data bit of the address 0.

As abovementioned, the second judgment circuit 330 is used for comparing whether the error address outputted by the first judgment circuit 320 is the same as the address stored in the error recording unit 310 and used for comparing whether the error bit outputted by the first judgment circuit 320 is the same as the bit stored in the error recording unit 310, so as to determine whether the ECC memory 180 has multi-bit error. In that case, the second judgment circuit 330 is able to judge that the error address (i.e. the address 0) outputted by the first judgment circuit 320 is the same as the field Addr1 (i.e. the address 0) stored in the error recording unit 310, and judge that the error bit (i.e. the $12^{th}$ data bit) outputted by the first judgment circuit 320 is different from the field EB1 (i.e. the $5^{th}$ bit) stored in the error recording unit 310. Therefore, it can judge that the ECC memory 180 has multi-bit error.

Please note that, in another case, if the second judgment circuit 330 judges that the error address and the error bit outputted by the first judgment circuit 320 are completely identical to the address field 410 and the bit field 420 recorded in the error recording unit 310, it represents that they are the same error. Therefore, the second judgment circuit 330 will judge that the ECC memory 180 does not have multi-bit error.

Moreover, according to an embodiment of the present invention, the second testing unit 140 can further include a counter 340 for counting the address number of the error recording unit 310, so as to control the error tolerance of the ECC memory 180. For example, the threshold for the error tolerance of the ECC memory 180 is set as "50", which indicates that at most fifty errors are allowed in the ECC memory 180. Therefore, when the error address number of the error recording unit 310 counted by the counter 340 exceeds 50, the second testing unit 140 outputs the second testing result TR2 indicating that the ECC 180 fails the test. The abovementioned threshold "50" for the error tolerance is merely an embodiment of the present invention, and should not be a limitation of the present invention.

Figure 5:
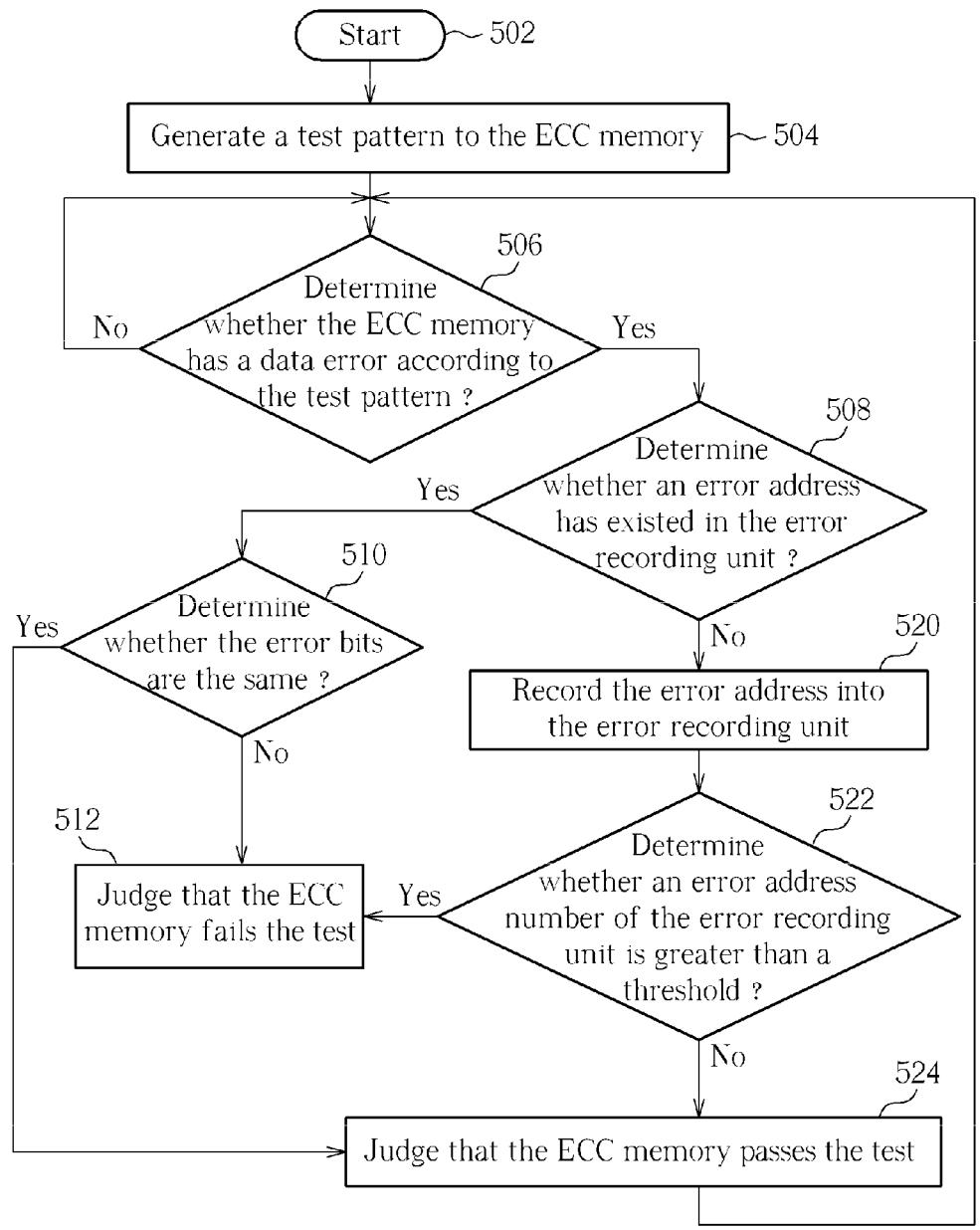
FIG. 5 is a flowchart illustrating a testing method for testing an ECC memory when the ECC logic circuit is disabled according to an exemplary embodiment of the present invention.

Please refer to FIG. 5. FIG. 5 is a flowchart illustrating a testing method for testing an ECC memory when the ECC logic circuit 230 is disabled according to an exemplary embodiment of the present invention. The method includes, but is not limited to, the following steps:

Step 502: Start.

Step 504: Generate a test pattern to the ECC memory.

Step 506: Determine whether the ECC memory has an error according to the test pattern. If the ECC memory has the error, go to Step 508; otherwise, repeat Step 506.

Step 508: Determine whether an error address has existed in the error recording unit. If the error address has existed in the error recording unit, go to Step 510; otherwise, go to Step 520.

Step 510: Determine whether the error bits are the same. If the error bits are the same, go to Step 524; otherwise, go to Step 512.

Step 512: Judge that the ECC memory fails the test.

Step 520: Store the error address into the error recording unit.

Step 522: Determine whether an error address number of the error recording unit is greater than a threshold. If the error address number of the error recording unit is greater than the threshold, to go Step 512; otherwise, go to Step 524.

Step 524: Judge that the ECC memory passes the test. Continue to execute Step 506.

The following description details how each element operates by collocating the steps shown in FIG. 5 and the elements shown in FIG. 1~FIG. 4. In Step 504, the test pattern generator 120 generates different test patterns TS to the ECC memory 180. In Step 506, the first judgment circuit 320 of the second testing unit 140 determines whether the data DS2 provided by the ECC memory 180 has the error according to the test pattern TS. If there is the error, the second judgment circuit 330 then confirms whether the error address has existed in the error recording unit 310 (i.e., Step 508). If the error address has not existed in the error recording unit 310, record this error address into the error recording unit 310 (i.e., Step 520) and confirm whether the error address number of the error recording unit 310 is greater than the threshold (i.e., Step 522). If the error address has existed in the error recording unit 310, the second judgment circuit 330 further determines whether the error bits are the same. (i.e., Step 510)

In Step 510, when the error bits are determined to be different from each other, it represents that the ECC memory 180 has multi-bit error. Therefore, the ECC memory 180 is judged to fail the test (i.e., Step 512). When the error bits are determined to be the same, it represents that this error is the same as the error recorded in the error recording unit 310. Therefore, the ECC memory 180 is judged to pass the test (i.e., Step 524), and continue to execute Step 506. Moreover, in Step 522, if the error address number of the error recording unit 310 counted by the counter 340 is greater than the threshold, it represents that the ECC memory 180 has too many errors. Therefore, the ECC memory 180 is judged to fail the test (i.e., Step 512), too. On the other hand, if the error address number of the error recording unit 310 counted by the counter 340 is not greater than the threshold, the ECC memory 180 is judged to pass the test and continue to execute Step 506 (i.e., Step 524).

Please note that, the steps of the abovementioned flowchart are merely a practicable embodiment of the present invention, and in no way should be considered to be limitations of the scope of the present invention. The method can include other intermediate steps or can merge several steps into a single step without departing from the spirit of the present invention. Those skilled in the art should observe that various modifications of these methods may be made.

In summary, the present invention provides a memory apparatus having a testing module and a related testing method for testing an ECC memory. When the ECC blocks (e.g. the parity bit storage blocks 220) are disabled, an error recording unit 310 is used for recording the error address and the error bit of the ECC memory so as to determine whether the ECC memory has multi-bit error. In addition, a counter can be adopted for counting the error address number of the error recording unit 310 in the present invention, which can control the total number of the memory errors so as to optimize the error tolerance.

Those skilled in the art will readily observe that numerous modifications and alterations of the device and method may be made while retaining the teachings of the invention.

What is claimed is:

1. A memory apparatus, comprising:
   an error correction code (ECC) memory, comprising:
   a plurality of data storage blocks, each data storage block having a corresponding address and storing a plurality of data bits;
   a plurality of parity bit storage blocks, each parity bit storage block storing a plurality of parity bits; and
   an error correction code (ECC) logic circuit for correcting the data bits stored in the data storage blocks according to the parity bits;
   a testing module, coupled to the memory, the testing module comprising:
   a test pattern generator, for generating a test pattern to the memory;
   at least one testing unit, comprising:
   a first judgment circuit, for reading a first data bit and a second data bit of the memory, and for determining whether the first data bit and the second data bit have an error according to the test pattern, wherein the first data bit corresponds to a first address in the memory and the second data bit corresponds to a second address in the memory;
   an error recording unit, coupled to the first judgment circuit, for recording the first address when the first data bit has the error;
   a second judgment circuit, coupled to the error recording unit, for comparing the second address in the memory with the first address recorded in the error recording unit so as to determine whether the memory has multi-bit error; and
   a counter for counting a number of addresses corresponding to errors of the error recording unit so as to determine an error tolerance;
   wherein the testing module determines whether the memory has multi-bit error when the ECC logic circuit is disabled
   wherein the testing module performs a first test according to the plurality of data bits and the plurality of parity bits when the ECC logic circuit is enabled, and
   wherein the testing module performs a second test according to only the plurality of data bits when the ECC logic circuit is disabled.

2. The memory apparatus of claim 1, wherein the error recording unit is further used for recording a first error bit in a data storage block to which the first data bit corresponds and for recording a second error bit in a data storage block to which the second data bit corresponds.

3. The memory apparatus of claim 2, wherein the second judgment circuit is further used for comparing the first error bit with the second error bit so as to determine whether the memory has multi-bit error.

4. The memory apparatus of claim 1, wherein the testing module performs a test to determine whether the ECC memory has multi-bit error when the ECC logic circuit is disabled.

5. The memory apparatus of claim 1, wherein each data storage block stores a 32-bit data.

6. The memory apparatus of claim 1, wherein the memory is a dynamic random access memory (DRAM) or a static random access memory (SRAM).

7. A testing method for testing an error correction code (ECC) memory, the ECC memory comprising a plurality of data storage blocks and an ECC logic circuit for correcting the data bits stored in the data storage blocks, each data storage block having a corresponding address and storing a plurality of data bits, a plurality of parity bit storage blocks each storing a plurality of parity bits, the testing method comprising:
  performing a first test according to the plurality of data bits and the plurality of parity bits when the ECC logic circuit is enabled and generating a first testing result;
  performing a second test according to only the plurality of data bits when the ECC logic circuit is disabled and generating a second testing result, wherein performing the second test comprises:
    generating a test pattern to the ECC memory;
    reading a first data bit and a second data bit of the memory;
    determining whether the first data bit and the second data bit have an error according to the test pattern, wherein the first data bit is stored into a first address in the memory and the second data bit is stored into a second address in the memory;
    when the first data bit has the error, recording the first address into an error recording unit;
    comparing the second address in the memory with the first address recorded in the error recording unit, so as to determine whether the memory has multi-bit error; and
    counting a number of addresses corresponding to errors of the error recording unit so as to determine an error tolerance; and
  determining whether the ECC memory passes testing based on at least one of the first testing result and the second testing result.

8. The testing method of claim 7, further comprising:
  recording a first error bit into a data storage block to which the first data bit corresponds; and
  recording a second error bit into a data storage block to which the second data bit corresponds.

9. The testing method of claim 8, further comprising: comparing the first error bit with the second error bit so as to determine whether the memory has multi-bit error.

10. The testing method of claim 7, wherein each data storage block stores a 32-bit data.

11. The testing method of claim 7, wherein the memory is a dynamic random access memory (DRAM) or a static random access memory (SRAM).

12. A method for testing a memory comprising an error correction code (ECC) logic circuit for correcting data bits stored in the memory, a memory further comprising a plurality of parity bits, the method comprising:
  performing a first test according to the plurality of data bits and the plurality of parity bits when the ECC logic circuit is enabled and generating a first testing result;
  performing a second test according to only the plurality of data bits when the ECC logic circuit is disabled and generating a second testing result, wherein performing the second test comprises:
    generating a test pattern for a memory comprising a plurality of data storage blocks, wherein each data storage block has a corresponding address;
    reading a first data bit and a second data bit from the memory;
    determining whether an error exists corresponding to the first bit data and the second bit data based on the test pattern, wherein the first data bit is stored at a first address in the memory and the second data bit is stored at a second address in the memory;
    responsive to determination of an error corresponding to the first data bit, recording the first address into an error recording unit, the error recording unit including a plurality of valid bit fields for indicating validity of corresponding address fields and bit fields;
    comparing the second address in the memory with the first address recorded in the error recording unit to determine whether the memory has a multi-bit error; and
    determining that a memory test failure has occurred based on a counted number of addresses corresponding to errors of the error recording unit exceeding an error tolerance;
  determining whether the memory passes testing based on at least one of the first testing result and the second testing result.

13. The method of claim 12, further comprising initializing each of the valid bit fields prior to generating the test pattern.

* * * * *